United States Patent

Chuang

[11] Patent Number: 6,083,804
[45] Date of Patent: Jul. 4, 2000

[54] METHOD FOR FABRICATING A CAPACITOR IN A DYNAMIC RANDOM ACCESS MEMORY

[75] Inventor: Shu-Ya Chuang, Hsinchu Hsien, Taiwan

[73] Assignee: United Semiconductor Corp., Hsinchu, Taiwan

[21] Appl. No.: 09/103,957

[22] Filed: Jun. 24, 1998

[30] Foreign Application Priority Data

Apr. 20, 1998 [TW] Taiwan .................................. 87105998

[51] Int. Cl.[7] .................................................. H01L 21/20
[52] U.S. Cl. .......................... 438/396; 438/240; 438/253; 438/397
[58] Field of Search ..................................... 438/238, 239, 438/240, 241, 242, 381, 396, 397, 398, 399, 253, 254, 255, 256

[56] References Cited

U.S. PATENT DOCUMENTS

| | | | |
|---|---|---|---|
| 5,432,116 | 7/1995 | Keum et al. ............................. | 438/397 |
| 5,543,346 | 8/1996 | Keum et al. ............................. | 438/397 |
| 5,721,168 | 2/1998 | Wu .......................................... | 438/253 |
| 5,837,594 | 6/1997 | Honma et al. .......................... | 438/396 |
| 5,953,618 | 10/1996 | Choi ....................................... | 438/396 |
| 5,981,337 | 11/1999 | Chuang .................................. | 438/253 |
| 5,998,259 | 12/1999 | Chuang .................................. | 438/253 |

*Primary Examiner*—Michael Trinh
*Assistant Examiner*—Jeff Vockrodt
*Attorney, Agent, or Firm*—Thomas, Kayden, Horstemeyer & Risley

[57] ABSTRACT

The invention is a method for fabricating a capacitor in a dynamic random access memory. The capacitor has double cylinder structure and is fabricated by utilizing an insulating side wall spacer to pre-define the capacitor structure. Then, a wet etching process is applied to remove the insulating side wall spacer and expose a surface of a structured lower electrode. Then, a dielectric thin film and an upper electrode are formed over the surface of the lower electrode sequentially to form the capacitor.

8 Claims, 4 Drawing Sheets

METHOD FOR FABRICATING A CAPACITOR IN A DYNAMIC RANDOM ACCESS MEMORY

BACKGROUND OF THE INVENTION

1. Field of the Invention

This invention relates to a fabricating method of a capacitor in a dynamic random access memory, and more particularly to a fabricating method of a capacitor with double cylinder structure.

2. Description of Related Art

In a dynamic random access memory (DRAM), generally, an array of capacitors on the substrate are storing the binary data by charging or discharging the capacitors. One capacitor acts one bit of memory for storing the binary data "0" or "1" corresponding to the status of capacitor being "charged" or "discharged", respectively. The action of read/write in the DRAM is done through a transfer field effect transistor (TFET), in which a source of the TFET is coupled to a bit line (BL), a drain is coupled to the capacitor and a gate is coupled to a word line (WL). The BL carries a voltage level to charge the capacitor through the TFET, where the TFET is selectively controlled by the WL to be activated or inactivated. Thus a writing action can be done. On the other hand, if one wants to read the binary data having been stored, the BL is switched to a comparator circuit, or a sense amplifier, to check the voltage status of the capacitor for the reading action. Therefore the charges stored in the capacitor is essential to a memory quality in the DRAM The charges stored in the capacitor depends on the capacitance of the capacitor. The capacitance is determined by the storing area of the storage electrode, the isolating reliability between an upper electrode and a lower electrode of the capacitor, and dielectric constant of dielectric, which has been chosen. To be able to store more data, the density of the capacitors used in the memory device tends to increase. This results in the storage charges would be decreased. If the storage charges can stay high, the affections of noise to the sense amplifier for reading can be effectively reduced and it is not necessary to refresh the voltage level of the capacitor, frequently.

While the integration is increasing, the size of memory cell in a DRAM is reduced, accordingly. As known by one skilled in the art, the reduced size of the capacitor gives a result of lower capacitance. If the capacitance is decreased, the soft error due to the α particles can happen with higher probability. Therefore, it is desired that a capacitor has a reduced size but can keep sufficient capacitance.

For another fact, in the conventional method for fabricating a capacitor, a photoresist is often used to define the structure of the capacitor so that the error of alignment happens quite easily and, therefore, affects the etching result. Then, the failing rate of production is certainly increased.

SUMMARY OF THE INVENTION

It is therefore an objective of the present invention to provide a double cylinder capacitor characterized by a double cylinder structure for making use of a large storing area to effectively increase the capacitance but keeping the size down. The double cylinder capacitor is preferably used in a dynamic random access memory.

It is another an objective of the present invention to provide the double cylinder capacitor, which is using a side wall spacer to define the structure of the capacitor. Therefore, the error of alignment for the fabrication can be reduced.

In accordance with the foregoing and other objectives of the present invention, the fabricating method for the double cylinder capacitor is utilizing an insulating side wall spacer to pre-define the capacitor structure. Then, a wet etching process is applied to remove the insulating side wall spacer and expose a surface of a structured lower electrode of the capacitor. Then, a dielectric thin film and an upper electrode are formed over the surface of the lower electrode sequentially to form the capacitor.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 1A–1I are schematically cross-sectional views illustrating a method for fabricating a capacitor in a DRAM, according to an embodiment of the invention.

Figure 1A:
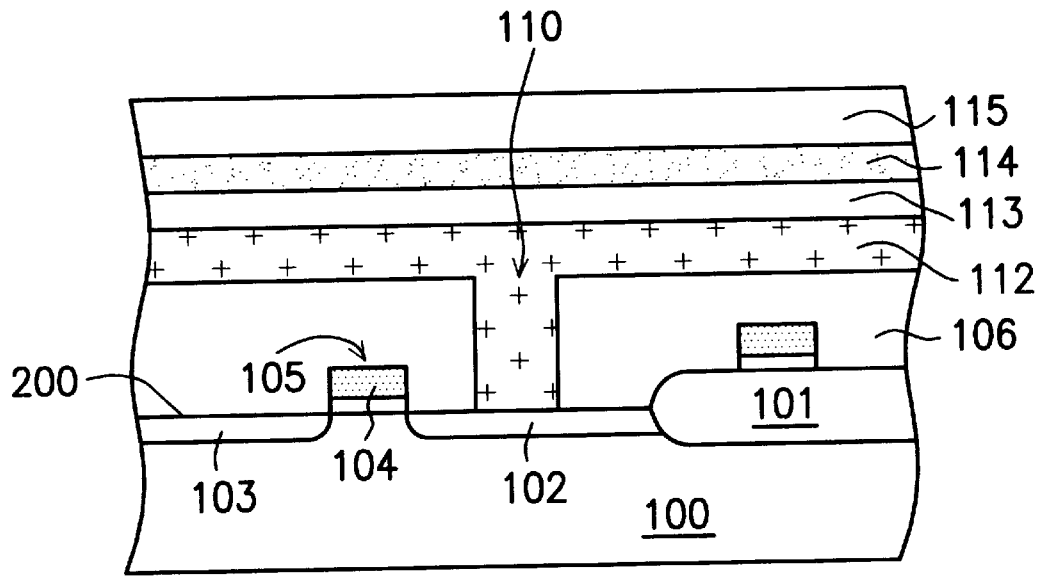
FIGS. 1A–1I are schematically cross-sectional views illustrating a method for fabricating a capacitor, according to an embodiment of the invention.

Referring to FIG. 1A, a semiconductor substrate 100, for example a p-type silicon substrate, is provided first with a substrate surface 200. A field oxide layer 101 is formed on the substrate surface 200 for isolation between field effect transistors, which are to be formed. The field oxide layer 101 can also be replaced by a shallow trench isolation structure. A field effect transistor (FET) 105 is formed over the substrate 100. The FET 105 has a gate 104 above the substrate surface 200 and two interchangeable source/drain regions 102, 103 under the substrate surface 200 on the both sides of the FET 105. Then, an insulating layer 106 is formed over the substrate 100. Then a contact window 110 is formed by defining on the insulating layer 106 to expose the interchangeable source/drain region 102. Then, a conductive layer 112 including doped polysilicon or other conductive material is formed over the insulating layer 106 and fills the contact window 110. Then a dielectric layer 113, a conductive layer 114 and a dielectric layer 115 are formed over the conductive layer 112 sequentially. The dielectric layer 113, 115 preferably include oxide and the conductive layer 114 preferably includes doped polysilicon or other conductive material.

Figure 1B:
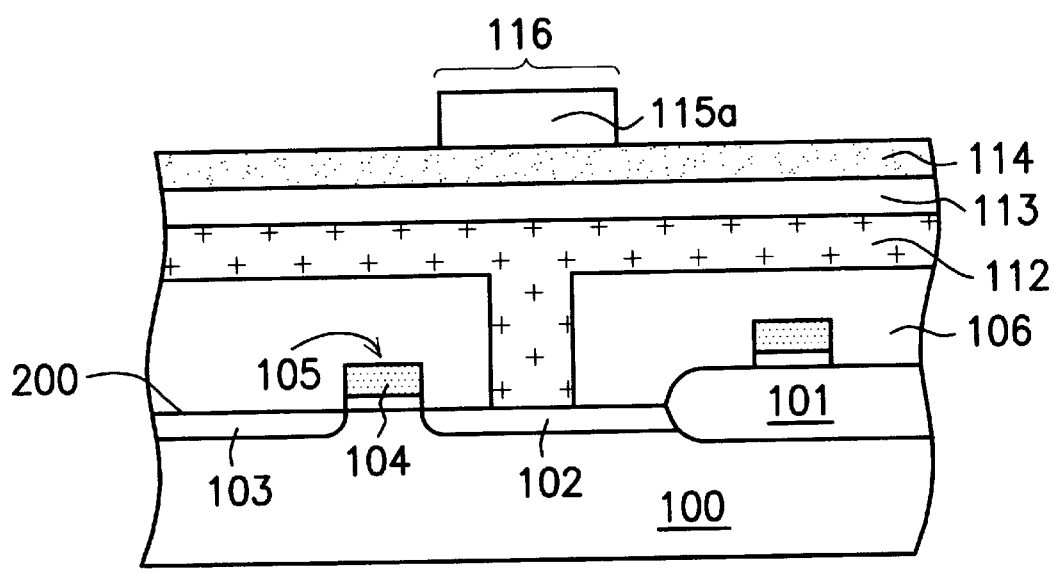

Referring to FIG. 1A and FIG. 1B, a pre-defined capacitor area 116 is defined on the dielectric layer 115 above the contact window 110. The dielectric layer 115 becomes a dielectric layer 115a and is done, for example, by photolithography and etching technologies through a photoresist (not shown).

Figure 1C:
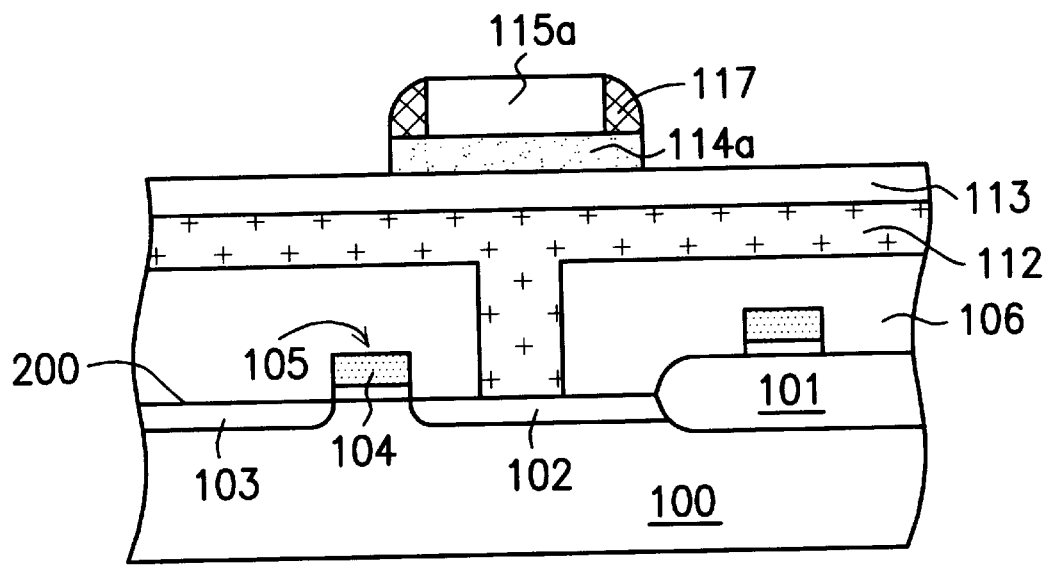

Referring to FIG. 1B and FIG. 1C, a doped polysilicon layer or other conductive material layer is pre-formed over the substrate 100. The doped polysilicon layer is defined to form a conductive side wall spacer 117 on the side of the dielectric layer 115a by applying an etch back technology on the doped polysilicon layer, in which the etch end point is set on the dielectric layer 115a. Then, by using the dielectric layer 115a and the conductive side wall spacer 117 as the mask, the conductive layer 114 is defined as a conductive layer 114a to expose a portion of dielectric layer 113. Since the conductive side wall spacer 117 and the conductive layer 114 are made of doped polysilicon, a thickness or a density of dopant for the conductive side wall spacer 117 have to be properly arranged to allow the side wall spacer 117 can survive after etching.

Figure 1D:
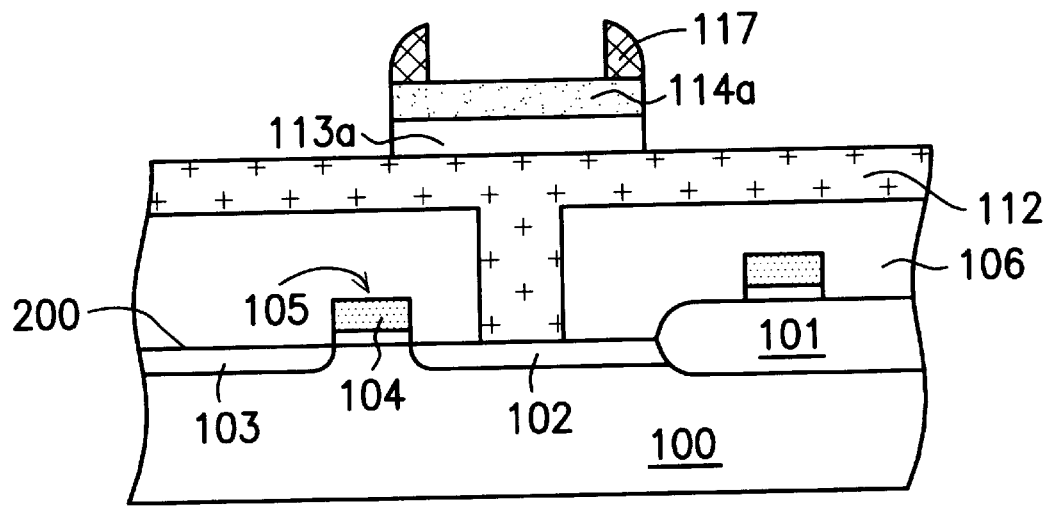

Referring to FIG. 1C and FIG. 1D, by using the conductive side wall spacer 117 as the etching mask, the dielectric layer is defined to form a dielectric layer 113a to expose the conductive layer 112 and, at the same time, the dielectric layer 115a is etched away to expose the conductive layer 114a. The etching includes a dry etching process.

Figure 1E:
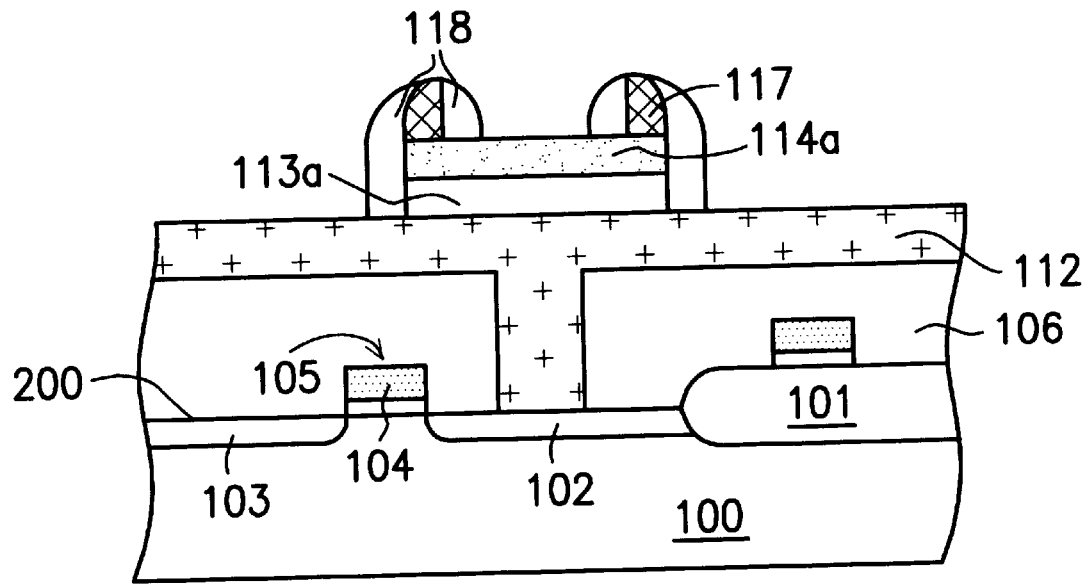

Referring to FIG. 1D and FIG. 1E, an insulating side wall spacer 118 preferably including oxide is formed on a side exposed periphery of the conductive side wall spacer, conductive layer 114a and dielectric layer 113a. The insulating side wall spacer 118 is formed partly over the conductive layer 114a and the dielectric layer 113a with a region the same as the thickness of the insulating side wall spacer 118. An etch back technology, for example dry etching, has been applied by setting the etch end point at the conductive layer 112. Therefore, the conductive layer 114a and the conductive layer 112 are still partly exposed.

Figure 1F:
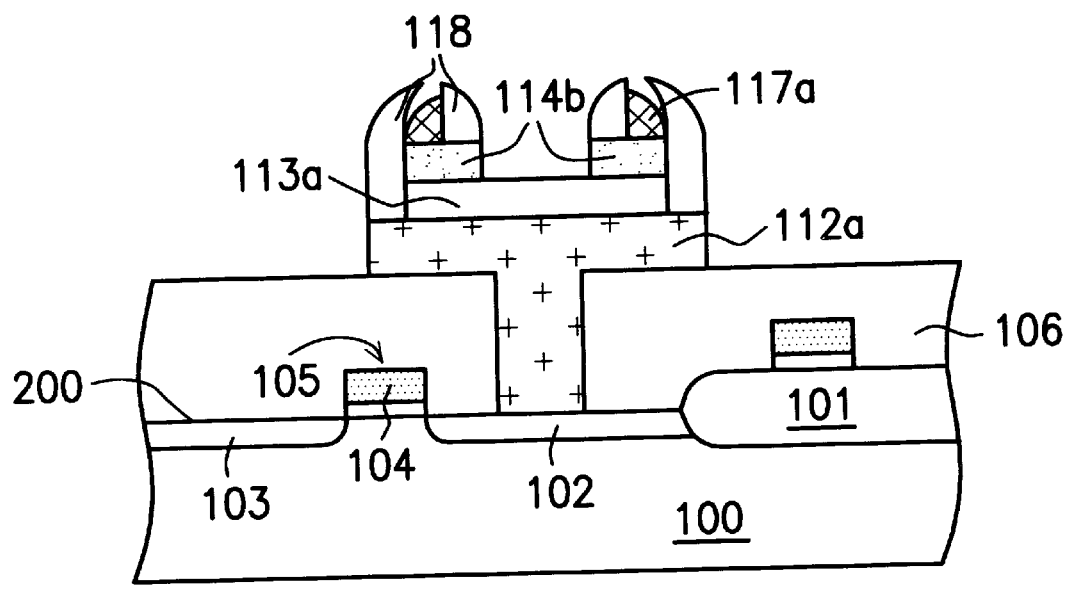

Referring to FIG. 1E and FIG. 1F, by using the insulating side wall spacer 118 as the etching mask, both the conductive layer 114a and the conductive layer 112 are defined to form a conductive layer 114b and a conductive layer 112a to expose the dielectric layer 113a and the insulating layer 106. At the same time, the conductive side wall spacer 117 is also etched as a conductive side wall spacer 117a. The etching includes a dry etching process.

Figure 1G:
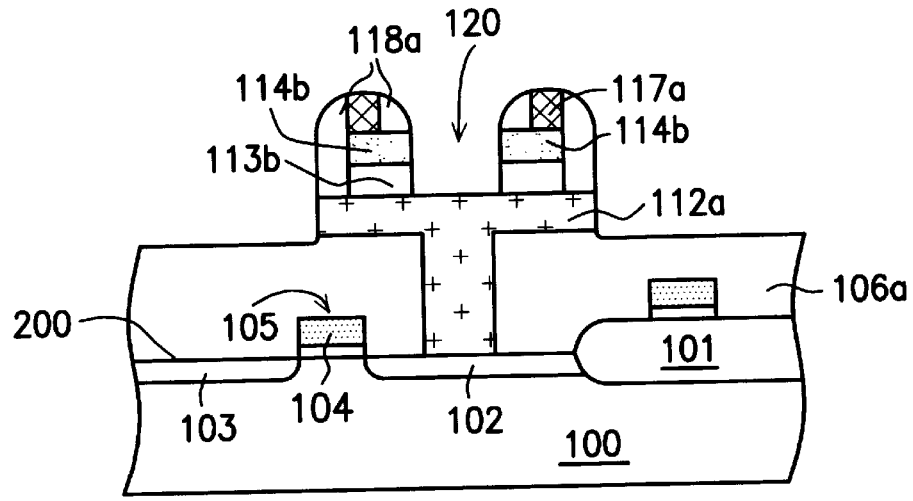

Referring to FIG. 1F and FIG. 1G, an etch back technology, for example dry etching, is applied on dielectric layer 113a to expose the conductive layer 112a. At the same time, the insulating side wall spacer 118 and the conductive side wall spacer 117a are rounded on the top. The insulating side wall spacer 118 becomes as an insulating side wall spacer 118a. Moreover, the exposed part of the insulating layer 106 is also etched away a little as an insulating layer 106a. The exposed part of the conductive layer 112a above the contact window 110 (as shown in FIG. 1A) is etched so that an opening 120 is formed.

Figure 1H:
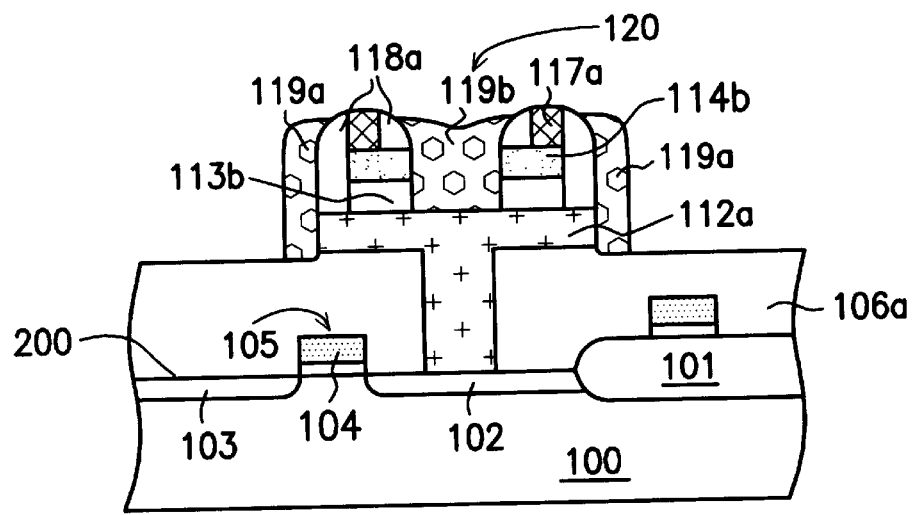

Referring to FIG. 1G and FIG. 1H, a conductive layer including doped polysilicon or other conductive material is deposited over the substrate 100 and the opening 120 is filled also. Then an etch back technology is applied by setting the etch end point at the insulating layer 106a to form a conductive plug 119a and a conductive side wall spacer 119b. The conductive plug 119a is over the insulating layer 106a with a range of the thickness of the conductive plug 119a and over the outer side periphery of the opening 120 of the conductive layer 112a and insulating side wall spacer 118a. The conductive side wall spacer 119b is filling the opening 120. Therefore, the conductive layer 112a, the conductive layer 114b, the conductive side wall spacer 117a, the conductive plug 119a and the conductive side wall spacer 119b are electrically coupled together to be a lower electrode of a capacitor, which is to be formed later.

Figure 1I:
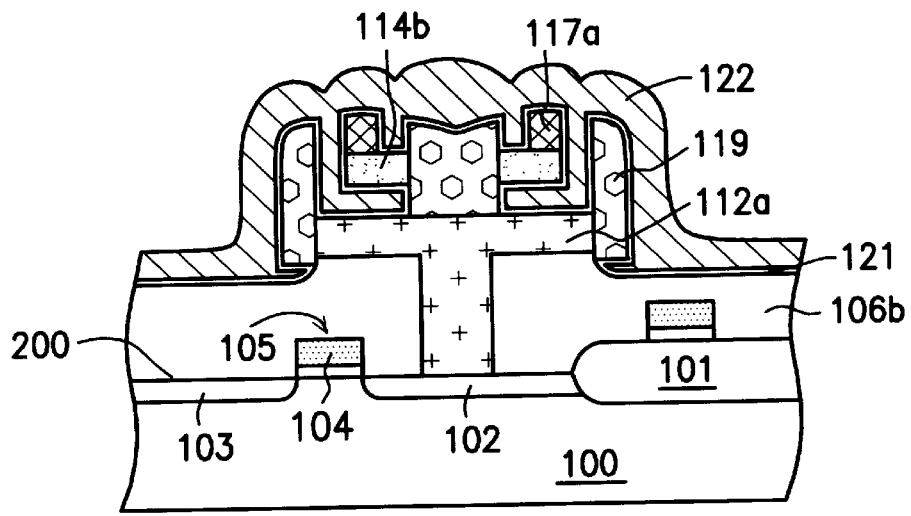

Referring to FIG. 1H and FIG. 1I, the insulating side wall spacer 118a and the dielectric layer 113b are removed by using a solution of HF for doing wet etching to completely expose the conducting surface of the lower electrode. At the same time, the exposed part of the insulating layer 106a is further etched again and becomes an insulating layer 106b. Then a dielectric thin film 121 is formed over the substrate including the exposed surface of the lower electrode and the insulating layer 106b. And then, a conductive layer 122 is formed over the dielectric thin film to act as an upper electrode. Therefore, a double cylinder capacitor of the invention is formed. In the above, the dielectric thin film 121 has a thickness about between 10 and 60 Angstrom and preferably includes oxide, nitride/oxide (NO), oxide/nitride/ oxide (ONO), $Ta_2O_5$, $Pb(Zr,Ti)O_3$ (PZT) or $(Ba,Sr)TiO_3$ (BST) with a property of high dielectric constant. The conductive layer can include doped polysilicon or other conductive material.

The double cylinder capacitor in the invention has been characterized as follows:

1. The formation of the lower electrode by utilizing the insulating side wall spacer themselves as the mask needs no additional masks for defining, in which the masks are needed in the conventional fabricating method so that the errors of alignment can appear quite often.

2. The structure of the double cylinder capacitor significantly increases the storing area for storing charges, which can reduce the happening of soft error.

The invention has been described using exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a double cylinder capacitor, comprising:

providing a substrate, in which a field effect transistor is formed thereon, wherein the field effect transistor comprises a gate and two source/drain regions;

forming an insulating layer over the substrate, in which a contact window is formed thereon to expose one of the source/drain regions;

forming a first conductive layer over the substrate to fill the contact window;

forming a first dielectric layer, a second conductive layer and a second dielectric layer over the first conductive layer sequentially;

patterning the second dielectric layer so that a portion of the second dielectric layer above the contact window is reserved and a portion of the second conductive layer is exposed;

forming a first conductive side wall spacer on a side periphery of the second dielectric layer, wherein the exposed portion of the second conductive layer is also removed;

removing the second dielectric layer and an exposed portion of the first dielectric layer by using the first conductive side wall spacer as a mask to expose the remaining second conductive layer and the remaining first conductive layer;

forming a second insulating side wall spacer over the remaining first conductive layer, the remaining second conductive layer and a combined side periphery of the remaining first dielectric layer, the remaining second conductive layer, the first conductive side wall spacer;

by using the second insulating side wall spacer as a mask removing a portion of the first conductive layer so as to expose the insulating layer and a portion of the second conductive layer so as to expose the first dielectric layer;

removing the exposed portion of the first dielectric layer to form an opening to expose the first conductive layer, wherein a top potion of the exposed insulating layer is removed also;

forming a conductive plug in the opening and then forming a third conductive side wall spacer over a combined periphery of the second insulating side wall spacer and the first conductive layer so that the conductive plug and the third conductive side wall spacer are electrically coupled together with the first conductive layer, the second conductive layer and the first conductive side wall spacer to act as a lower electrode of the capacitor;

removing the first dielectric layer and the second insulating side wall spacer; and forming a dielectric thin film and a third conductive layer sequentially over the substrate, wherein the third conductive layer acts as an upper electrode.

2. The method of claim 1, wherein the first conductive side wall spacer comprises doped polysilicon.

3. The method of claim 1, wherein the second insulating side wall spacer comprises oxide.

4. The method of claim 1, wherein the third conductive side wall spacer comprises doped polysilicon.

5. The method of claim 1, wherein said step of removing the second dielectric layer and a portion of the first dielectric layer comprises a dry etching process.

6. The method of claim 1, wherein said step of removing the portion of the first conductive layer and the portion of the second conductive layer comprises a dry etching process.

7. The method of claim 1, wherein said step of removing the first dielectric layer and the second insulating side wall spacer comprises a wet etching process.

8. The method of claim 1, wherein the dielectric thin film comprises oxide, nitride/oxide (NO), oxide/nitride/oxide (ONO), $Ta_2O_5$, $Pb(Zr,Ti)O_3$ (PZT) or $(Ba,Sr)TiO_3$ (BST).

* * * * *